United States Patent [19]
Figura et al.

[11] Patent Number: 5,438,016
[45] Date of Patent: Aug. 1, 1995

[54] METHOD OF SEMICONDUCTOR DEVICE ISOLATION EMPLOYING POLYSILICON LAYER FOR FIELD OXIDE FORMATION

[75] Inventors: Thomas A. Figura; Nanseng Jeng, both of Boise, Id.

[73] Assignee: Micron Semiconductor, Inc., Boise, Id.

[21] Appl. No.: 205,663

[22] Filed: Mar. 2, 1994

[51] Int. Cl.⁶ .............................................. H01L 21/76
[52] U.S. Cl. ............................................ 437/67; 437/72
[58] Field of Search ................................... 437/67, 72; 148/DIG. 50, DIG. 85, DIG. 86, DIG. 17

[56] References Cited

FOREIGN PATENT DOCUMENTS

| | | | |
|---|---|---|---|
| 59-11645 | 1/1984 | Japan | 437/72 |
| 61-228650 | 10/1986 | Japan | 437/72 |
| 513566 | 1/1993 | Japan | 437/72 |

OTHER PUBLICATIONS

IBM Technical Disclosure Bulletin, vol. 29, No. 2, Jul. 1986 pp. 943–946.

Park et al., "A Novel LOCOS-Type Isolation Technology Free of the Field Oxide Thinning Effect", Extended Abstracts of the 1993 International Conference on Solid State Devices and Materials, Makuhari, 1993, pp. 528–530.

*Primary Examiner*—George Fourson
*Attorney, Agent, or Firm*—Kevin D. Martin

[57] ABSTRACT

A process for forming field oxide on a semiconductor substrate having reduced field oxide thinning comprises forming an oxide layer over a semiconductor substrate, and forming a protective layer over the oxide layer. A mask is formed over the protective layer thereby forming exposed and covered regions of the protective layer. The exposed portions of the protective layer are removed to form at least first, second, and third disconnected protective structures, wherein the distance between the first and second protective structures is smaller than the distance between the second and third protective structures. The oxide layer and a portion of the substrate between the protective structures is removed to expose a portion of the substrate. A blanket polycrystalline silicon (poly) layer is formed over the substrate, and the poly layer is isotropically etched to remove the poly from between the second and third protective structures and to leave a portion of the poly between the first and second structures. The poly between the first and second protective structures is oxidized to form regions of field oxide having a substantially uniform thickness across the substrate. The oxidation between the first and second protective structures can also include substrate oxidation once the poly is consumed.

21 Claims, 2 Drawing Sheets

5,438,016

METHOD OF SEMICONDUCTOR DEVICE ISOLATION EMPLOYING POLYSILICON LAYER FOR FIELD OXIDE FORMATION

This invention was made with Government support under Contract No. MDA972-93-C-0033 awarded by Advanced Research Projects Agency ("ARPA"). The Government has certain rights in this invention.

FIELD OF THE INVENTION

This invention relates to the field of semiconductor manufacture, and more particularly to the formation of a thick oxide layer.

BACKGROUND OF THE INVENTION

Many types of semiconductor devices such as dynamic random access memories (DRAMs), static rams (SRAMs), and programmable read-only memories (PROMs) are formed in much the same way. Layers of oxide, nitride, and polycrystalline silicon (polysilicon or poly) are formed over a substrate such as monocrystalline silicon or gallium arsenide to form field and gate oxide, capacitor cell plates, word and digit lines, and various other structures.

To form a thick oxide layer 10 such as field oxide shown in FIG. 1, a thin blanket oxide layer 12 is formed over a substrate 14. A blanket layer of protective material such as nitride 16A–16D is formed over the oxide layer 12, and a patterned mask (not shown) is formed over the protective layer to cover regions of protective material and leaving other regions of protective material exposed. The exposed protective regions (and often the underlying oxide layer) is etched to expose the underlying oxide layer (or underlying substrate). The substrate is then oxidized to form the field oxide as shown in FIG. 1.

Depending on the design of the device being formed, the field oxide can often require varying distances between an adjacent field oxide. To form the field oxide, the protective structures formed have varying distances between them as shown in FIG. 1. The distance between protective structure 16A and protective structure 16B, for example, is smaller than the distance between protective structure 16B and protective structure 16C. One problem which can result from differing distances between protective structures is field oxide thinning. When the substrate is oxidized, the smaller distance between protective structures results in a thinner field oxide than in regions that have a larger distance between protective structures, such as shown in FIG. 1. This can result in a device that has less desirable electrical characteristics than a device in which the field oxide thickness is uniform across the substrate. A process for reducing field oxide thinning would be desirable.

SUMMARY OF THE INVENTION

A process for forming a semiconductor device comprises the steps of forming a first oxide layer over a semiconductor substrate, a protective layer over the first oxide layer, and a patterned mask over the protective layer thereby forming exposed and covered portions of the protective layer. Next, the exposed portions of the protective layer are removed to form at least first, second, and third disconnected protective structures such that a first distance between the first and second protective structures is smaller than a second distance between the second and third protective structures. The oxide layer underlying the exposed protective structures is also removed along with a portion of the substrate underlying the exposed protective structures. This exposes a portion of the substrate.

A second oxide layer is then formed over the exposed portions of the substrate, and a blanket polycrystalline silicon layer is formed over the substrate. The polycrystalline silicon layer is etched to remove the polycrystalline silicon from between the second and third protective structures and leaving a portion of the polycrystalline silicon between the first and second protective structures.

Finally, the polycrystalline silicon layer between the first and second protective structures is oxidized to form field oxide.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
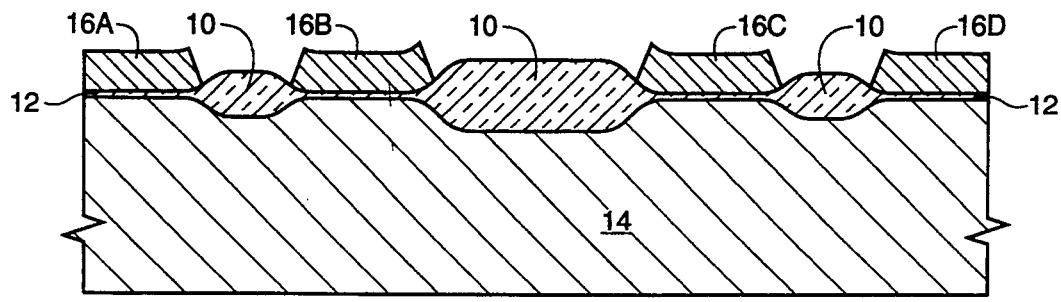
FIG. 1 is a cross-section of a conventionally formed structure having field oxide thinning.
Figure 2:
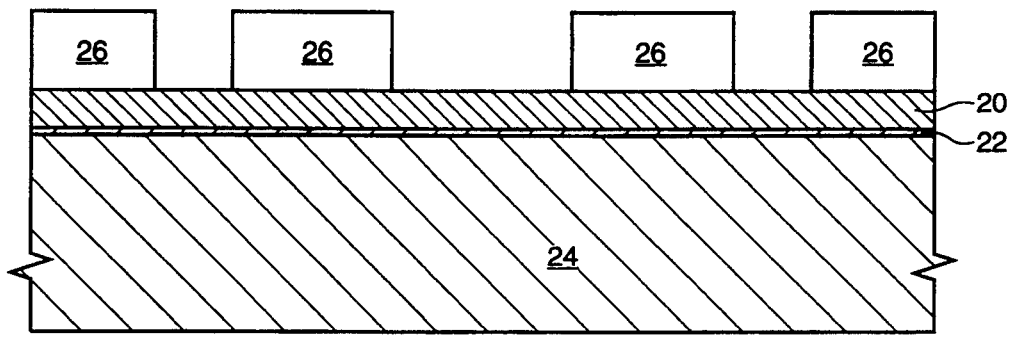
FIG. 2 shows a cross-section of a first step in one embodiment of the inventive process.

FIGS. 2–5 show one embodiment of the inventive process. In FIG. 2, a protective layer 20 is formed over a thin first oxide layer 22, which is formed over a semiconductor substrate 24 such as silicon or gallium arsenide. The protective layer 20 can comprise nitride and oxide, or any material which prevents the underlying material from oxidizing. In any case, a patterned mask 26 is formed over the protective layer 20 thereby forming exposed and covered portions of the protective layer. An anisotropic (vertical) etch is performed, which removes the exposed portions of the protective layer. This forms at least first 30A, second 30B, and third 30C disconnected protective structures (a forth, 30D, is also shown) such that a first distance between first 30A and second 30B protective structures is smaller than a second distance between the second 30B and third 30C protective structures. The first oxide 22 and a portion of the substrate 24 underlying the exposed protective structures are also removed, thereby exposing a portion of the substrate 24. Between about 200 angstroms (Å) to 2000 Å of substrate can be removed. Subsequent to the etch, a second oxide layer 32 is formed over the exposed substrate, for example by oxidizing the exposed substrate 24. A second oxide layer (shown in FIG. 3) of from about 100 Å to about 1000 Å thick is sufficient although other thickness may also function adequately. In an alternate embodiment, this oxide layer 32 can be omitted.

Figure 3:
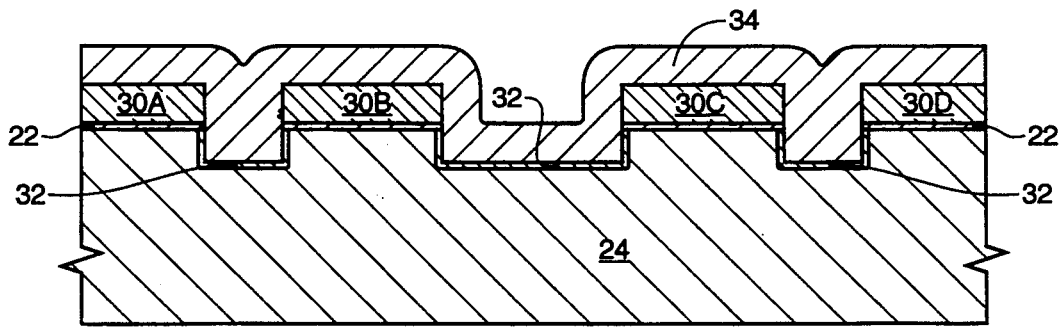
FIG. 3 shows the FIG. 2 structure after an etch, a oxidation, and formation of a polycrystalline silicon (poly) layer.

Whether or not the second oxide layer 32 is formed, a blanket polycrystalline silicon (poly) layer 34 is formed over the substrate 24 as shown in FIG. 3. The thickness of the poly layer can vary depending on the distance between the protective structures. The poly layer should be formed thick enough to bridge in the narrowest distances between the protective structures as shown, but not completely fill in the wider distances between the protective structures. This effectively results in a thicker poly layer over the substrate in the narrow regions (between 30A and 30B, for example) and a thinner poly layer over the substrate in the wide regions (between 30B and 30C). A poly layer deposited at least half as thick as the narrow distance is wide would sufficiently bridge the narrow distance.

Figure 4:
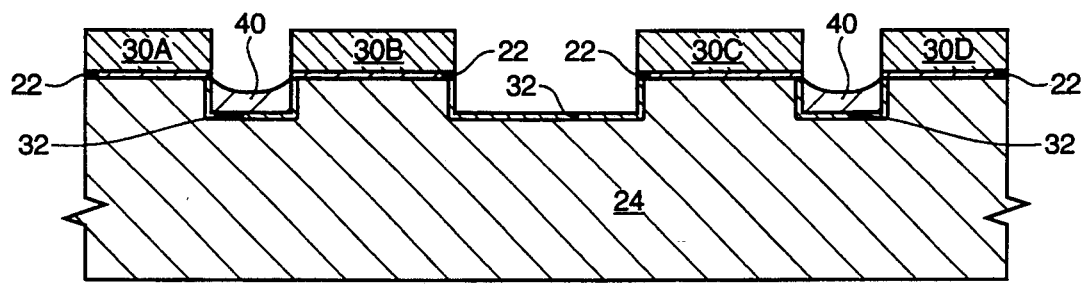
FIG. 4 shows the FIG. 3 structure after the poly layer is etched.

Next, an isotropic etch of the poly layer 34 is performed using the second oxide layer 32 as an etch stop, and the results are shown in FIG. 4. If the second oxide layer is not formed, the etch can be timed to remove only the desired material. In either case, etch removes the poly from between the widely-spaced protective structures (the poly between 30B and 30C), but leaves a portion of the poly between the narrowly-spaced protective structures (the poly between 30A and 30B). The thickness of the poly layer depends on the amount of field oxide thinning that is to be overcome, and can be determined by one of skill in the art. In general, more severe field oxide thinning requires a thicker poly layer in the narrow regions.

Figure 5:
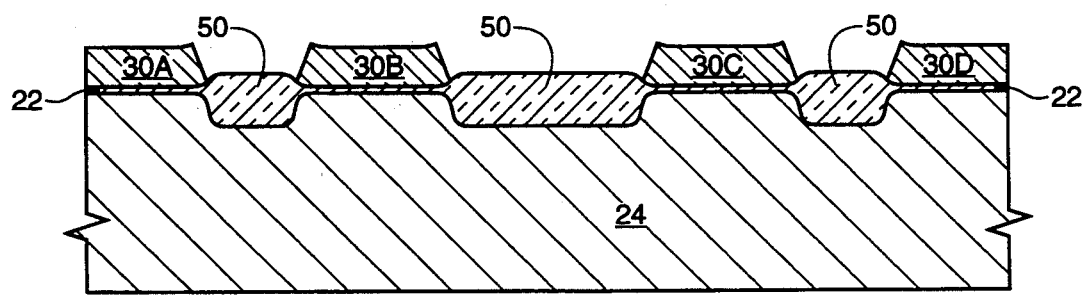
FIG. 5 shows the FIG. 4 structure after formation of the field oxide.

Finally, the poly between the first and second protective structures is oxidized to form field oxide 50 as shown in FIG. 5. The polycrystalline silicon (doped or undoped) oxidizes at a faster rate than the second oxide layer, and thus forms a thicker oxide than the second oxide layer. The more rapid oxidation of the poly layer offsets the field oxide thinning in the narrow regions, and thus the thickness of the field oxide across the substrate is substantially uniform. For example, with field oxide having a target thickness of 4000 Å, the process easily can be optimized by one of skill in the art from the description herein so the field oxide in the narrow areas and the wide regions can fall between 3800 Å and 4200 Å. The oxidation between the first and second protective structures can also include substrate oxidation once the poly is consumed.

The oxidation time required to form a sufficient field oxide layer may be reduced with the inventive process over conventional processes. In addition to forming a more uniform field oxide layer across the substrate, encroachment of the oxide under the protective structures may be decreased due to the reduced oxidation time.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A process for forming a semiconductor device, comprising the following steps:

a) forming a patterned protective layer over a semiconductor substrate, said protective layer having at least first, second, and third disconnected protective structures such that a first distance between said first and second protective structures is narrower than a second distance between said second and third protective structures;

b) removing a portion of said substrate between said protective structures thereby exposing portions of said substrate;

c) forming a blanket polycrystalline silicon layer over said substrate;

d) isotropically etching said polycrystalline silicon layer to remove said polycrystalline silicon from between said second and third protective structures and leaving a portion of said polycrystalline silicon between said first and second protective structures;

e) oxidizing said substrate between said second and third protective structures and said polycrystalline silicon layer between said first and second protective structures.

2. The process of claim 1 further comprising the step of forming an oxide layer over said exposed portions of said substrate between steps b) and c).

3. The process of claim 2 wherein said oxide layer formed over said exposed portions of said substrate is from about 100 Å to about 1000 Å.

4. The process of claim 1 wherein said protective layer comprises nitride and oxide.

5. The process of claim 1 wherein said polycrystalline silicon layer formed during step c) is thicker between said first and second protective structures than between said second and third protective structures.

6. The process of claim 1 further comprising the step of doping said polycrystalline silicon layer.

7. The process of claim 1 wherein said field oxide between said first and second protective structures and between said second and third protective structures has a substantially uniform thickness.

8. A process for forming a semiconductor device, comprising the following steps:

a) forming an oxide layer over a semiconductor substrate;

b) forming a protective layer over said oxide layer;

c) forming a patterned mask over said protective layer thereby forming exposed and covered portions of said protective layer;

d) removing said exposed portions of said protective layer to form at least first, second, and third disconnected protective structures such that a first distance between said first and second protective structures is smaller than a second distance between said second and third protective structures;

e) removing said oxide layer between said protective structures, and a portion of said substrate between said protective structures thereby exposing a portion of said substrate;

f) forming a blanket polycrystalline silicon layer over said substrate;

g) isotropically etching said polycrystalline silicon layer to remove said polycrystalline silicon from between said second and third protective structures and leaving a portion of said polycrystalline silicon between said first and second protective structures;

h) oxidizing said polycrystalline silicon layer between said first and second protective structures to form field oxide.

9. The process of claim 8 further comprising the step of forming an oxide layer over said exposed portions of said substrate between steps e) and f).

10. The process of claim 9 wherein said oxide layer formed over said exposed portions of said substrate is from about 100 Å to about 1000 Å.

11. The process of claim 8 wherein said protective layer comprises nitride and oxide.

12. The process of claim 8 wherein said polycrystalline silicon layer formed during step f) is thicker between said first and second protective structures than between said second and third protective structures.

13. The process of claim 8 further comprising the step of doping said polycrystalline silicon layer.

14. The process of claim 8 further comprising the step of oxidizing said substrate between said second and third protective structures to form regions of field oxide, wherein said field oxide between said first and second protective structures is about as thick as said field oxide between said second and third protective structures.

15. A process for forming field oxide on a semiconductor substrate, comprising the following steps:
   a) forming an oxide layer over a semiconductor substrate;
   b) forming a protective layer over said oxide layer;
   c) forming a patterned mask over said protective layer thereby forming exposed and covered portions of said protective layer;
   d) removing said exposed portions of said protective layer to form at least first, second, and third disconnected protective structures such that a first distance between said first and second protective structures is smaller than a second distance between said second and third protective structures;
   e) removing said oxide layer between said protective structures, and a portion of said substrate between said protective structures thereby exposing a portion of said substrate;
   f) forming a blanket polycrystalline silicon layer over said substrate;
   g) isotropically etching said polycrystalline silicon layer to remove said polycrystalline silicon from between said second and third protective structures and leaving a portion of said polycrystalline silicon between said first and second protective structures;
   h) oxidizing said polycrystalline silicon layer between said first and second protective structures and between said second and third protective structures to form regions of field oxide, said field oxide between said first and second protective structures being about as thick as said field oxide between said second and third protective structures.

16. The process of claim 15 further comprising the step of forming an oxide layer over said exposed portions of said substrate between steps e) and f).

17. The process of claim 16 wherein said oxide layer formed over said exposed portions of said substrate is from about 100 Å to about 1000 Å.

18. The process of claim 15 wherein said protective layer comprises nitride and oxide.

19. The process of claim 15 wherein said polycrystalline silicon layer formed during step f) is thicker between said first and second protective structures than between said second and third protective structures.

20. The process of claim 15 further comprising the step of doping said polycrystalline silicon layer.

21. The process of claim 14 wherein said polycrystalline silicon layer between said first and second protective structures and said substrate between said second and third protective structures are oxidized simultaneously during step h).

* * * * *